United States Patent [19]

Shinoda

[11] Patent Number: 5,060,270

[45] Date of Patent: Oct. 22, 1991

[54] REVERBERATION CIRCUIT

[75] Inventor: Ryuichi Shinoda, Tokyo, Japan

[73] Assignee: Pioneer Electronic Corporation, Tokyo, Japan

[21] Appl. No.: 511,166

[22] Filed: Apr. 19, 1990

[30] Foreign Application Priority Data

Apr. 20, 1989 [JP] Japan .............................. 1-45573[U]

[51] Int. Cl.[5] .......................... H04R 5/00; H03G 3/00

[52] U.S. Cl. .......................................... 381/63; 381/22; 381/28; 381/61; 381/62; 84/629; 84/630; 84/631; 84/706; 84/707; 84/708

[58] Field of Search ........................ 381/61, 63, 62, 22, 381/28; 84/629, 630, 631, 706, 707, 708

[56] References Cited

U.S. PATENT DOCUMENTS 4,731,848 3/1988 Kendall ................................ 381/63

4,811,401 3/1989 Brown .................................. 381/61

*Primary Examiner*—James L. Dwyer

*Assistant Examiner*—Jack Chiang

*Attorney, Agent, or Firm*—Sughrue, Mion, Zinn, Macpeak & Seas

[57] ABSTRACT

A reverberation circuit comprises an amplifier, attenuation circuit, a feedback component, and a delay circuit. The amplifier, delay circuit, and feedback component form a feedback loop. The amplifier amplifies an input signal supplied to an input terminal and outputs an amplified signal to the delay circuit. The output of the delay circuit is fed through a feedback component back to the amplifier. The feedback component controllably varies the feedback amount of the delayed signal to the amplifier in accordance with the desired depth of reverberation. An attenuation circuit is placed in the feedback loop, or before or after the feedback loop. The attenuation circuit selectively attenuates the level of specific frequency component of a signal passing therethrough whose frequency may be different depending on the depth of reverberation or feedback amount. The attenuation circuit is adjusted in interlocked relation with the feedback component such that when the feedback amount is increased, the level of the specific frequency components in the output signal of the reverberation circuit is decreased.

8 Claims, 3 Drawing Sheets

REVERBERATION CIRCUIT

BACKGROUND OF THE INVENTION

1. Field of the Invention

The present invention relates to a reverberation circuit for reverberating signals such as speech sound and music.

2. Prior Art

A reverberation circuit is a circuit for reverberating speech sound and music to create a sound field such as a concert hall and is widely used in, for example, a Karaoke device which is an apparatus for reproducing an instrumental part of a tune to which a user can sing.

FIG. 4 shows a general arrangement of a prior art reverberation circuit. In FIG. 4, the reverberation circuit includes an OP amp 1, a delay circuit 2, an input resistor 3, a feedback resistor 4, and a reverberation time adjusting resistor 5. The OP amp 1, the input resistor 3, and the feedback resistor 4 form a negative feedback inverting amplifier. The input signal to the inverting amplifier is amplified by the OP amp 1, then is delayed a predetermined amount of time by the delay circuit 2, and finally is fed back to the input terminal of the OP amp 1 through the reverberation time adjusting resistor 5, thereby circulating the delayed signal through the feedback loop to produce reverberated sound. The reverberation time can be adjusted at will be adjusting the reverberation adjusting resistor 5 to change the level of feedback signal.

The aforementioned reverberation circuit is of a sort of comb filter the period of which is the delay time of the delay circuit 2. Due to the comb filter characteristics, when the input signal to the reverberation circuit is cut off, the reverberated output sound decays much slower in high frequencies than in lower frequencies.

This problem is not so serious if the reverberation time T is short, but quite serious if a long reverberation time T is to be set, causing the trailing end of the reverberated sound to become "screechy" regardless of the types of sound and voice, e.g. men's voices and women's voices.

SUMMARY OF THE INVENTION

An amplifier, delay circuit, and feedback means form a feedback loop as a whole. The amplifier amplifies an input signal supplied to an input terminal thereof and outputs an amplified signal to the succeeding delay circuit. the output of the delay circuit is fed through the feedback means back to the amplifier-input. The feedback means controllably varies the feedback amount of the delayed signal from the output of the delay circuit to the amplifier to obtain a desired depth of reverberation. An attentuation circuit is placed within the feedback loop, or before or after the feedback loop. The attentuation circuit operates to attenuate a signal passing therethrough such that the frequency components in different ranges may be selectively attenuated in accordance with the feedback amount. The attenuation circuit is adjusted in interlocked relation with the feedback means such that when the feedback amount is increased, the levels of the specific frequency components in the output signal from the reverberation circuit is decreased. Thus, eliminating the possibility of the reverberated sound to be "screechy" regardless of the types of sound and voice, e.g. men's voices and women's voices.

BRIEF DESCRIPTION OF THE DRAWINGS

Features and other objects of the invention will be more apparent from the detailed description of the preferred embodiments with reference to the accompanying drawings in which.

DETAILED DESCRIPTION OF THE INVENTION

Operation

An input signal is amplified to a convenient signal level and is then fed to a delay circuit. The signal output from the delay circuit is then fed back to the input terminal of the amplifier through a reverberation time adjusting resistor. This completes a feedback loop of the signal as a reverberation adding circuit. The reverberated signal is obtained at the output of the delay circuit. The depth of reverberation can be increased by varying the reverberation adjusting resistor to increase the feedback amount. The attenuation circuit is incorporated within feedback loop of the signal, or before or after the reverberation adding circuit, and selectively attenuates specific frequency components of a signal passing therethrough whose frequency may be different in accordance with the depth of reverberation or feedback amount. The frequency and the attenuation of the attenuation circuit may be controllably variable by adjusting a variable resistor in interlocked relation with the reverberation time adjusting resistor such that as the reverberation time is increased, the level of high frequency component in the output of the attenuation circuit decreases. Thus, the high frequency components are effectively attenuated so that screechy sound is eliminated even when the reverberation time is increased.

First embodiment

Figure 1:
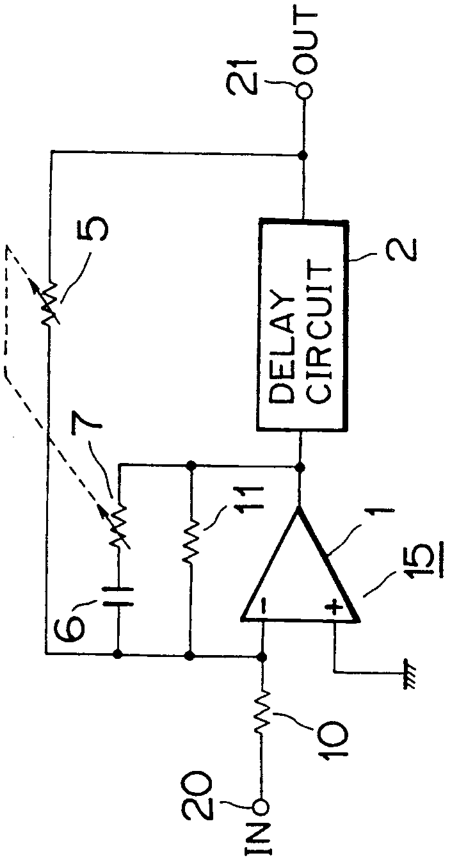
FIG. 1 is a schematic diagram of a first embodiment of a reverberation circuit according to the present invention.
Figure 4:
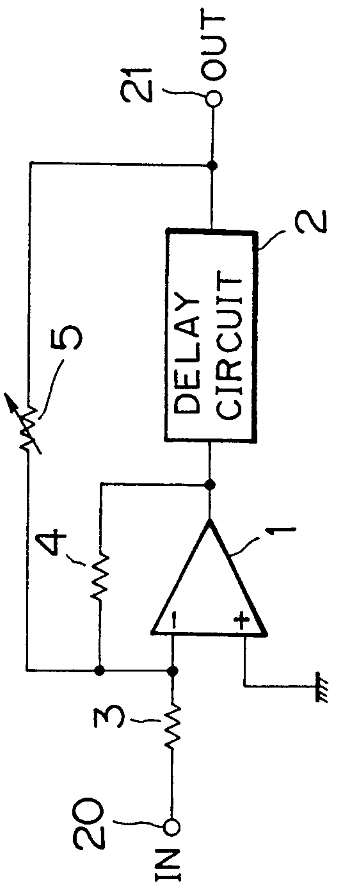
FIG. 4 PRIOR ART
FIG. 4 is a schematic diagram of a prior art reverberation circuit.

The present invention will be described in detail with reference to the drawings. FIG. 1 shows a first embodiment of a reverberation circuit according to the present invention. Elements similar to those in FIG. 4 have been given similar reference numerals. The reverberation circuit according to the invention is constructed of the attenuation circuit 15 and the delay circuit 2. The attenuation circuit 15 is of an inverted negative feedback amplifier with variably controllable gain at high frequencies. The negative feedback amplifier has an input resistor 10, an OP amp 1, a feedbak resistor 11 connected across the inverting input terminal of the OP amp 1 and the output terminal of the OP amp 1, and a CR feedback circuit in the form of a series connection of a capacitor 6 and a variable resistor 7. The CR feedback circuit is connected in parallel with a feedback resistor 11. Varying either the value of the capacitor 6 or the value of the resistor 7 permits the level of feedback signal as well as the cut-off frequency of the attenuation circuit 15 which behaves like a low-pass filter. In the present invention, the resistor 7 is variable for the sake of design economics. The output of the attenuation circuit 15 is fed to a delay circuit 2 which in turn feeds a delayed signal through a reverberation time adjusting resistor 5 back to the negative input terminal of the OP amp 1.

In operation, the input signal to an input terminal 20 is amplified by the OP amp 1, is delayed a predetermined delay time by a delay circuit 2, and is fed back to the inverting input terminal of the OP amp 1 through the reverberation time adjusting resistor 5, thereby circulating the signal through the feedback loop.

At this time, due to the comb filter characteristics, particular frequency components in the delayed signal, which is circulating through the feedback loop, tend to decay more slowly than the other frequency components in the loop.

The specific high frequency components are fed back to the inverting input terminal of the OP amp 1 through the CR feedback circuit consisting of the capacitor 6 and the variable resistor 7 in proportion to the setting of reverberation time at that time. Thus, the gain of the attenuation circuit 15 for the specific high frequency components decreases, thereby eliminating the screechy sound or particular frequency components in the reverberated sound.

Second embodiment

Figure 2:
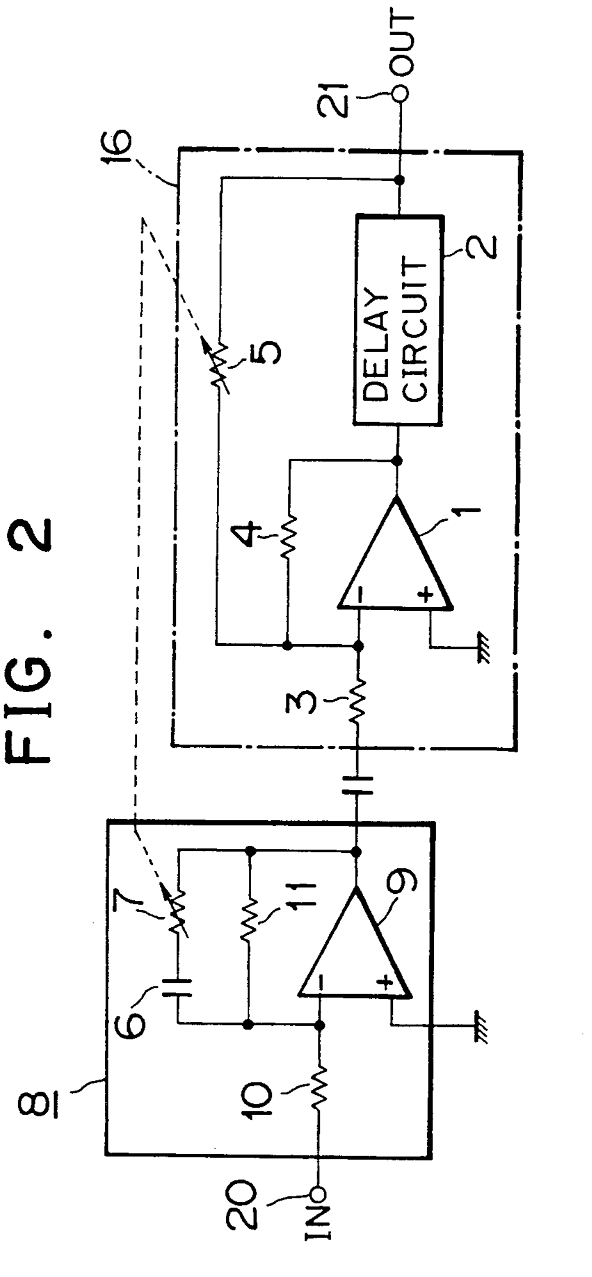
FIG. 2 is a schematic diagram of a second embodiment of the invention.

FIG. 2 shows a second embodiment of the invention. An attenuation circuit 8 is followed by the reverberation adding circuit 16. The attenuation circuit 8 is of the same construction as the inverted negative feedback amplifier 15 in the first embodiment. The attenuation circuit 8 is formed of an OP amp 9, an input resistor 10 connected to the input terminal 20, a feedback resistor 11, and a series circuit of a capacitor 6 and a variable resistor 7 connected across the output and input terminals of the OP amplifier 9.

The reverberation-time adjusting resistor 5 is adjusted in interlocked relation with the variable resistor 7 such that as the reverberation time is increased, the level of high frequency components in the output of the attenuation circuit 8 decreases. In this manner, the level of high frequency components in the output of the reverberation circuit is decreased preventing the "screechy" sound.

Third embodiment

Figure 3:
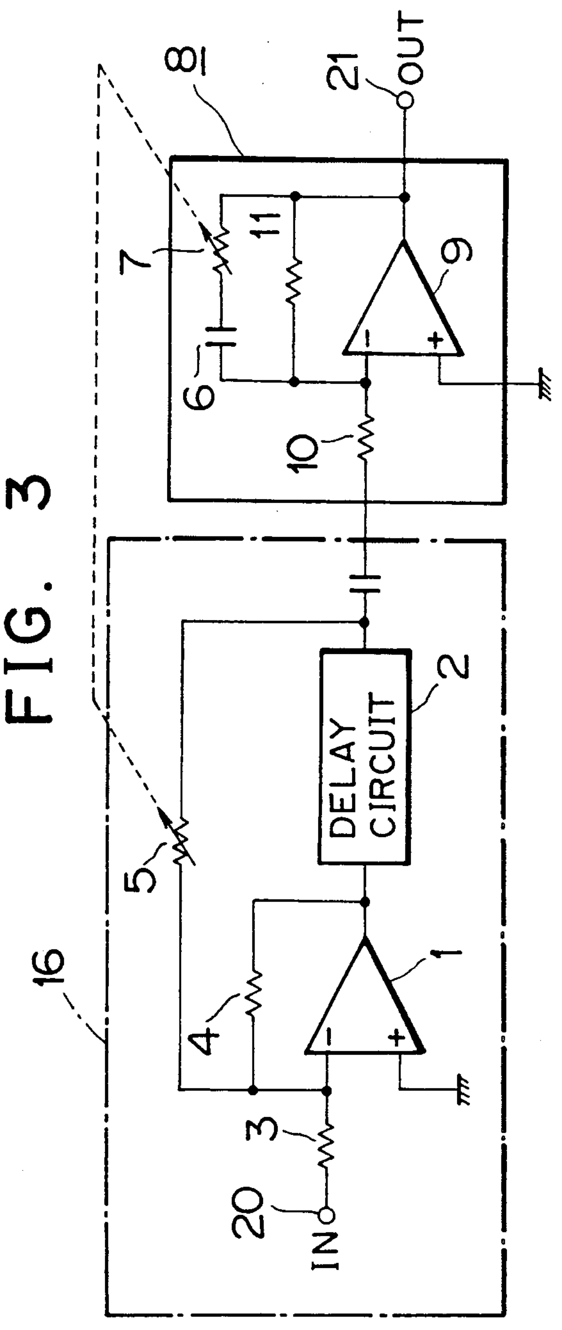
FIG. 3 is a schematic diagram of a third embodiment.

FIG. 3 shows a third embodiment of the invention.

The reverberation adding circuit 16 precedes the attenuation circuit 8, as opposed to the second embodiment where the reverberation adding circuit 16 follows the attenuation circuit 8.

Figure 5:
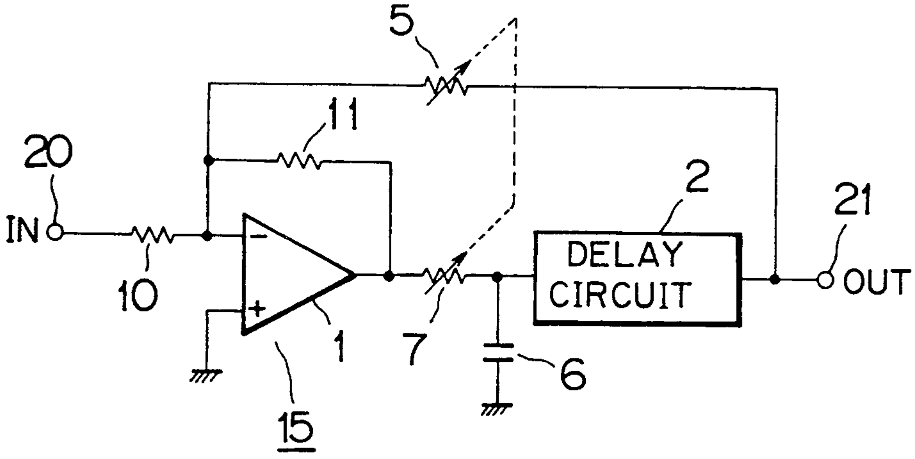
FIG. 5 shows an example of an attenuation circuit in the form of combined passive elements, a capacitor and a resistor.

While in the embodiments thus described, the circuit for attenuating the high frequency components or attenuation circuit has been described as being in the form of an active filter implemented by the combination of CR elements and an operational amplifier, the attenuation circuit may also be formed of the combination of passive elements such as inductors, capacitors, and resistors. FIG. 5 shows an example of the reverberation circuit the attenuation circuit of which is in the form of a CR passive filter.

What is claimed is:

1. A reverberation circuit comprising:

an input terminal (20);

an output terminal (21);

an amplifier (1) for amplifying an input signal to said input terminal and outputting an amplified signal;

a delay circuit (2) for delaying said amplified signal and outputting a delayed signal to said output terminal (21);

feedback means (5) for feeding back the delayed signal from said delay circuit (2) to said amplifier (1), said feedback means (5) controllably varying a feedback amount of said delayed signal to said amplifier (1) in accordance with a desired depth of reverberation; and attenuation means (6,7) for selectively attenuating levels of variable frequency components of a signal passing therethrough, said variable frequency components being varied in frequency in accordance with said feedback amount, said attenuation means being operated in interlocked relation with the feedback means such that when said feedback amount is increased, levels of said variable frequency components in an output signal from said output terminal (21) are decreased.

2. A reverberation circuit according to claim 1, wherein said feedback means is a variable resistor.

3. A reverberation circuit according to claim 2, wherein said attenuation means is a series circuit of a capacitor and a variable resistor, and is connected to said amplifier such that said attenuation means forms a negative feedback loop for said amplifier.

4. A reverberation circuit according to claim 2, wherein said attenuation means is a low pass filter formed of at least one capacitor and at least one variable resistor.

5. A reverberation circuit according to claim 2, wherein said attenuation means is connected between said delay circuit and said output terminal.

6. A reverberation circuit according to claim 5, wherein said attenuation means is formed of a negative feedback amplifier having a series circuit of a capacitor and a variable resistor connected to said negative feedback amplifier such that said attenuation means forms a negative feedback loop for said amplifier.

7. A reverberation circuit according to claim 1, wherein said attenuation means is connected between said input terminal and said amplifier.

8. A reverberation circuit according to claim 7, wherein said attentuation means is formed of a negative feedback amplifier having a series circuit of a capacitor and a variable resistor connected to said negative feedback amplifier such that said attenuation means forms a negative feedback loop for said amplifier.

* * * * *